(12) United States Patent
Hawryluk et al.

(10) Patent No.: US 8,796,053 B2
(45) Date of Patent: Aug. 5, 2014

(54) PHOTOLITHOGRAPHIC LED FABRICATION USING PHASE-SHIFT MASK

(75) Inventors: Andrew M. Hawryluk, Los Altos, CA (US); Robert L. Hsieh, Los Altos, CA (US); Warren W. Flack, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 138 days.

(21) Appl. No.: 12/928,862

(22) Filed: Dec. 21, 2010

(65) Prior Publication Data

US 2012/0153323 A1    Jun. 21, 2012

(51) Int. Cl.
| | |
|---|---|
| H01L 33/22 | (2010.01) |
| H01L 21/30 | (2006.01) |
| G03F 7/20 | (2006.01) |
| G03F 1/26 | (2012.01) |
| H01L 33/00 | (2010.01) |

(52) U.S. Cl.
CPC .............. H01L 33/22 (2013.01); H01L 33/007 (2013.01); H01L 2933/0083 (2013.01); G03F 7/703 (2013.01); G03F 1/26 (2013.01); G03F 7/70283 (2013.01)
USPC .................. 438/29; 438/5; 438/311; 438/478; 257/79; 257/88; 257/98; 257/103

(58) Field of Classification Search
CPC ............................ H01L 33/22; H01L 33/0093
USPC ............................................. 257/79, 98, 103
See application file for complete search history.

(56) References Cited

U.S. PATENT DOCUMENTS

| | | | |
|---|---|---|---|
| 5,633,102 A * | 5/1997 | Toh et al. ........................ | 430/5 |
| 5,982,476 A * | 11/1999 | Uematsu ....................... | 355/67 |
| 6,091,085 A | 7/2000 | Lester | |
| 7,704,684 B2 * | 4/2010 | Rogers et al. .................. | 430/325 |
| 7,732,106 B2 * | 6/2010 | Tejnil et al. ...................... | 430/5 |
| 2001/0044056 A1 | 11/2001 | Kokubo | |

(Continued)

FOREIGN PATENT DOCUMENTS

| | | |
|---|---|---|
| JP | H07-234499 A | 9/1995 |
| JP | 2004-191621 A | 12/2002 |

OTHER PUBLICATIONS

Lee et al., "Increasing the extraction efficiency of AlGaInP LEDs via n-side surface roughening," IEEE Phot. Tech. Lett. vol. 17, No. 11, Nov. 2005, pp. 2289-2291.

(Continued)

*Primary Examiner* — Matthew W Such
*Assistant Examiner* — David Spalla
(74) *Attorney, Agent, or Firm* — Opticus IP Law PLLC

(57) ABSTRACT

Photolithographic methods of forming a roughened surface for an LED to improve LED light emission efficiency are disclosed. The methods include photolithographically imaging a phase-shift mask pattern onto a photoresist layer of a substrate to form therein a periodic array of photoresist features. The roughened substrate surface is created by processing the exposed photoresist layer to form a periodic array of substrate posts in the substrate surface. A p-n junction multilayer structure is then formed atop the roughened substrate surface to form the LED. The periodic array of substrate posts serve as scatter sites that improve the LED light emission efficiency as compared to the LED having no roughened substrate surface. The use of the phase-shift mask enables the use of affordable photolithographic imaging at a depth of focus suitable for non-flat LED substrates while also providing the needed resolution to form the substrate posts.

19 Claims, 9 Drawing Sheets

(56) References Cited

U.S. PATENT DOCUMENTS

| | | |
|---|---|---|
| 2003/0057444 A1 | 3/2003 | Niki et al. |
| 2003/0203318 A1 | 10/2003 | Ohsaki |
| 2004/0016936 A1 | 1/2004 | Kubo et al. |
| 2005/0179130 A1 | 8/2005 | Tanaka et al. |
| 2006/0240604 A1 | 10/2006 | Yamaguchi et al. |
| 2007/0003878 A1* | 1/2007 | Paxton et al. ............ 430/311 |
| 2007/0184360 A1* | 8/2007 | Chen ............................. 430/5 |
| 2008/0070413 A1* | 3/2008 | Chen et al. ................. 438/700 |
| 2009/0042111 A1* | 2/2009 | Tejnil et al. ................... 430/5 |
| 2010/0025717 A1 | 2/2010 | Fujii et al. |
| 2010/0163901 A1* | 7/2010 | Fudeta ........................ 257/98 |
| 2010/0295014 A1 | 11/2010 | Kang et al. |
| 2011/0129948 A1* | 6/2011 | Hsieh et al. ................ 438/16 |

OTHER PUBLICATIONS

Search Report, Hungarian Patent Office, Reported by Intellectual Property Office of Singapore, for Counterpart Singapore Patent Application No. 189554.

Japanese Office Action for JP 2001-265752, which is the Japanese counterpart to U.S. Appl. No. 12/928,861.

* cited by examiner

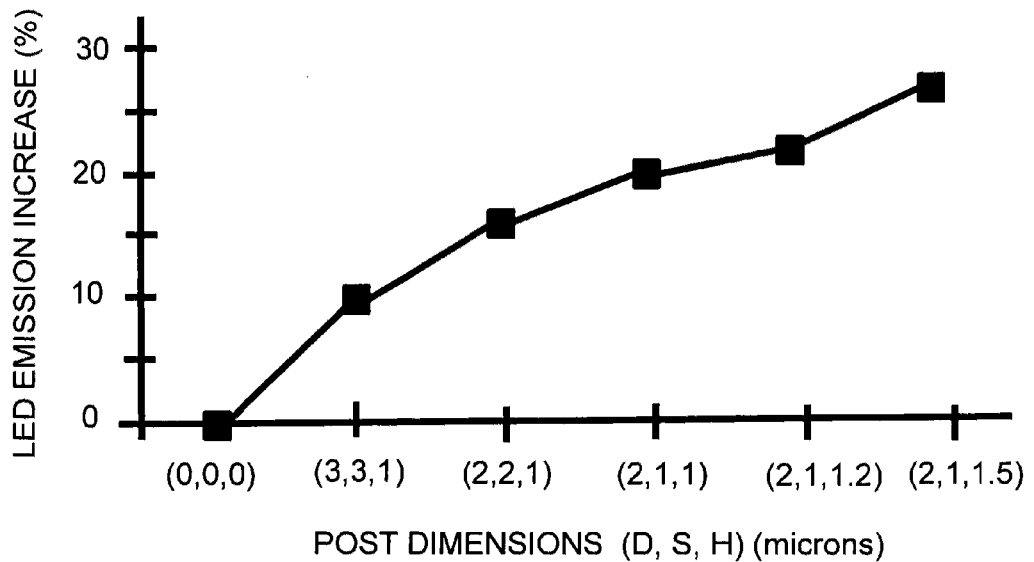
FIG. 2
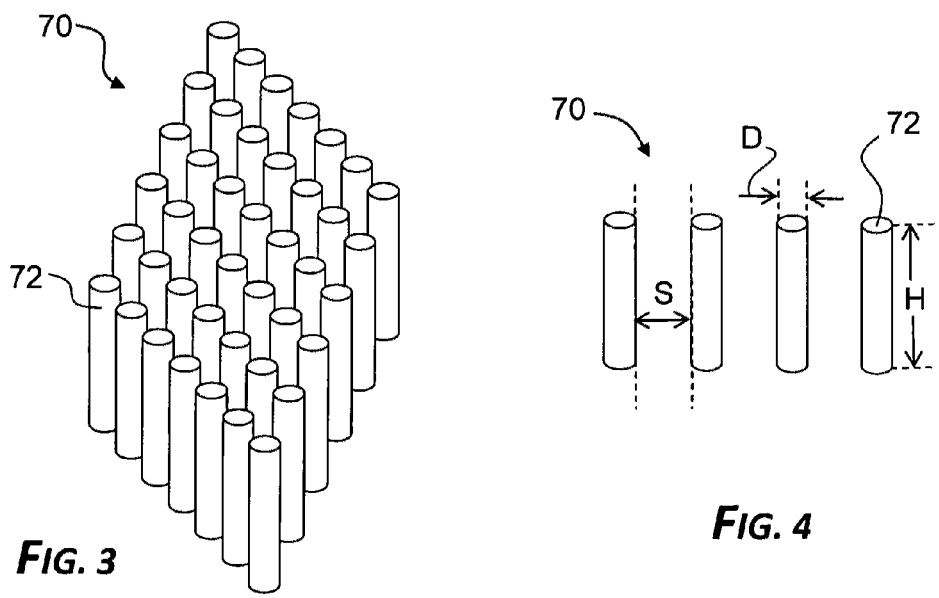
FIG. 3
FIG. 4

US 8,796,053 B2

PHOTOLITHOGRAPHIC LED FABRICATION USING PHASE-SHIFT MASK

FIELD

The present disclosure relates generally to the fabrication of light-emitting diodes (LEDs), and in particular relates to photolithographic systems and methods for LED fabrication using a phase-shift mask to increase the LED light emission efficiency.

BACKGROUND ART

LEDs are used for a variety of lighting applications (e.g., full-color displays, lamps, traffic lights, holiday lights, etc.), and are increasingly finding additional applications as LED technology improves and the cost of LEDs decreases.

LEDs are becoming increasingly more efficient due to continuous improvements in LED fabrication and LED design. However, a general limitation on LED light emission efficiency is due to total internal reflection of the light generated within the LED. For example, in a gallium-nitride-(GaN)-based LED, n-doped and p-doped GaN layers are supported by a semiconductor substrate (e.g., sapphire) having a surface. The n-doped and p-doped GaN layers sandwich an active layer, and one of the GaN layers has a surface that interfaces with air. Light is generated in the active layer and is emitted equally in all directions. However, GaN has a relatively high refractive index of about 3. As a result, there exists at the GaN-air interface a maximum-incident-angle cone ("exit cone") within which the light exits the p-GaN-air interface, but outside of which light is reflected back into the GaN structure due to Snell's Law.

To improve LED light emission efficiency, certain LEDs have been fabricated with a roughened substrate surface. The roughened substrate surface scatters the internally reflected light, causing some of the light to fall within the exit cone and exit the LED, thereby improving the light emission efficiency of the LED.

In a manufacturing environment, it is desirable to have a controllable and consistent method of forming the roughened substrate surface so that the LEDs have an identical structure and identical performance. The present method of roughening the substrate surface using abrasion is not a repeatable process and is thus not well suited for high-volume LED manufacturing.

SUMMARY

An aspect of the disclosure is a photolithographic method of forming a roughened surface for an LED to improve LED light emission efficiency. The method includes providing a semiconductor substrate having a surface covered with photoresist. The method also includes photolithographically imaging a phase-shift mask pattern onto the photoresist. The phase-shift mask pattern includes a periodic array of first and second phase-shift regions and a first spatial frequency. The photolithographic imaging forms in the photoresist a periodic array of photoresist features having a second spatial frequency substantially double the first spatial frequency. The method also includes defining the roughened surface by processing the photoresist and the photoresist features therein to form a corresponding periodic array of substrate posts in the substrate surface. The method further includes forming a p-n junction multilayer structure atop the roughened substrate surface to form the LED, with the periodic substrate posts serving as scatter sites that improve the LED light emission efficiency as compared to the LED having no roughened substrate surface.

Another aspect of the disclosure is a method of forming a LED. The method includes photolithographically exposing photoresist supported by a semiconductor substrate to form in the photoresist an array of photoresist posts, including passing illumination light through a phase-shift mask having a periodic pattern comprising first and second phase-shift regions. The method also includes processing the photoresist to form an array of substrate posts that defined a roughened substrate surface. The method further includes forming a p-n multilayer structure atop the roughened substrate surface to form the LED, wherein the roughened substrate surface acts to scatter light generated by the p-n multilayer structure to increase an amount of light emitted by the LED as compared to the LED having an unroughened substrate surface.

Another aspect of the disclosure is a LED product formed by a process that includes photolithographically exposing photoresist supported by a semiconductor substrate to form therein an array of photoresist posts, including passing illumination light through a phase-shift mask, with the phase-shift mask having a periodic pattern of first and second phase-shift regions. The process also includes processing the photoresist to form an array of substrate posts that defined a substrate roughened surface. The process further includes forming a p-n multilayer structure atop the roughened substrate surface to form the LED, wherein the roughened substrate surface acts to scatter light generated by the p-n multilayer structure to increase an amount of light emitted by the LED as compared to the LED having an unroughened substrate surface.

Additional features and advantages of the disclosure are set forth in the detailed description that follows, and in part will be readily apparent to those skilled in the art from that description or recognized by practicing the embodiments as described herein, including the detailed description which follows, the claims, as well as the appended drawings.

It is to be understood that both the foregoing general description and the following detailed description presented below, and are intended to provide an overview or framework for understanding the nature and character of the disclosure as it is claimed. The accompanying drawings are included to provide a further understanding of the disclosure, and are incorporated into and constitute a part of this specification. The drawings illustrate various embodiments of the disclosure, and together with the description serve to explain the principles and operations of the disclosure.

BRIEF DESCRIPTION OF THE DRAWINGS

FIG. 2 is a plot of the measured increase in LED (light) emission (%) versus post dimension (microns) for an LED such as shown in FIG. 1 and having a uniform array of posts that define a roughened sapphire substrate surface;

FIG. 3 is a perspective view of a portion of an example uniform array of posts;

FIG. 4 is a close-up perspective view of four adjacent posts in an array of posts, showing the edge-to-edge post spacing S, the post diameter D and the post height H;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts.

Example LED Structure

Figure 1:
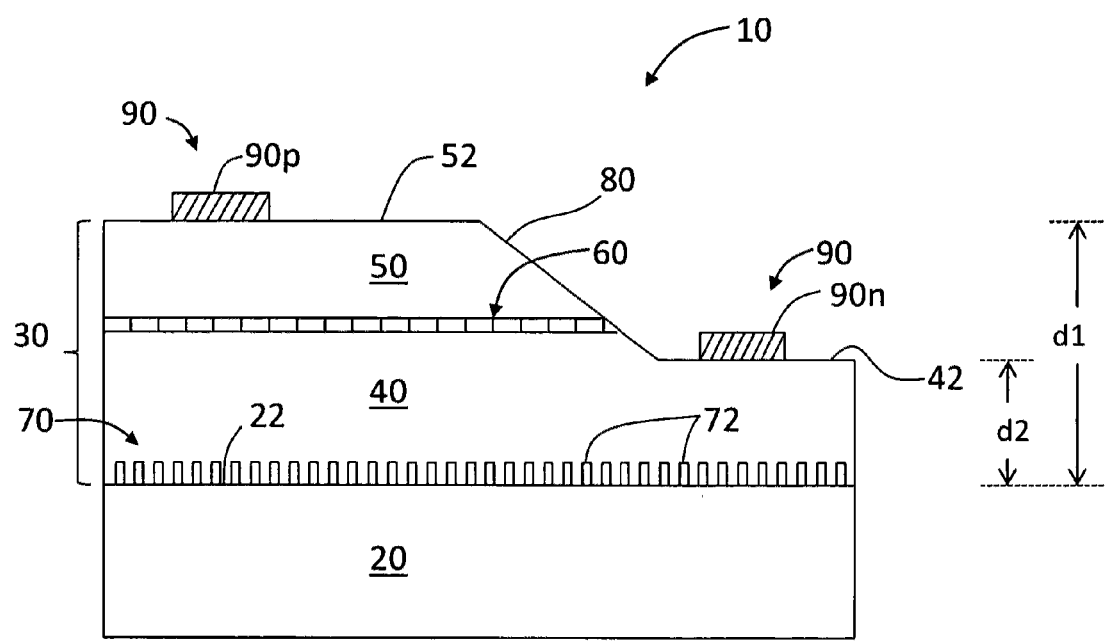
FIG. 1 is a schematic cross-sectional diagram of an example GaN-based LED that includes a roughened substrate surface defined by an array of posts.

FIG. 1 is a schematic cross-sectional diagram of an example GaN-based LED 10. Example GaN-based LEDs are described in U.S. Pat. Nos. 6,455,877 and 7,259,399 and 7,436,001, which patents are incorporated by reference herein. The present disclosure is not limited to GaN-based LEDs, and is directed to any type of LED formed using photolithographic imaging and processing techniques and that could benefit from an increased light emission due to a roughened substrate surface formed by an array of posts as described herein.

LED 10 includes a substrate 20 having a surface 22. Example materials for substrate 20 include sapphire, SiC, GaN, Si, etc. Disposed atop substrate 20 is a GaN multilayer structure 30 that includes a n-doped GaN layer ("n-GaN layer") 40 and a p-doped GaN layer ("p-GaN layer") 50 with a surface 52. The n-GaN layer 40 and the p-GaN layer 50 sandwich an active layer 60, with the n-GaN layer being adjacent substrate 20. In other Ga-based LED embodiments, GaN multilayer structure 30 is reversed so that the p-GaN layer 50 is adjacent substrate 20. Active layer 60 comprises, for example, a multiple quantum well (MQW) structure such as undoped GaInN/GaN superlattices. GaN multilayer structure 30 thus defines a p-n junction, and is also referred to herein more generally as a p-n junction multilayer structure. In examples, surface 52 can be roughened to increase the LED light emission therethrough.

Substrate surface 22 includes an array 70 of posts 72 that define a substrate surface roughness. In an example described in greater detail below, array 70 of posts 72 is etched into substrate surface 22 so that posts 72 are made of the substrate material. To increase LED light emission efficiency, posts 72 preferably have dimensions (e.g., a diameter or width D) that are 2× to 10× larger than the emitted LED wavelength $\lambda_{LED}$. It is important to note that, while the emitted LED wavelength $\lambda_{LED}$ might be, for example, between 400 and 700 nm, the LED wavelength in the GaN layers 40 and 50 is roughly 2.5× smaller because of the GaN index of refraction n, which makes the wavelength in the GaN layers approximately 150 to 250 nm (i.e., $\lambda_{LED}/n$). In an example, to efficiently scatter the light within n-GaN layer 40, posts 72 have a dimension D of about 0.5 micron to about 3 microns. Also in an example, the edge-to-edge spacing S between posts 72 can vary from 0.5 micron to 3 microns, and the post height H can be up to about 3 microns (see FIG. 3 and FIG. 4).

LED 10 is shown in FIG. 1 as having a sloped portion 80 formed in GaN multilayer structure 30. Sloped portion 80 forms an exposed surface portion 42 of n-GaN layer 40 that acts as a ledge for supporting one of two electrical contacts 90, namely n-contact 90n. Example n-contact materials include Ti/Au, Ni/Au, Ti/Al, or combination thereof. The other electrical contact 90 is the p-contact 90p, which is arranged on p-GaN surface 52. Example p-contact materials include Ni/Au and Cr/Au. An example distance d1 is about 4 microns, and an example distance d2 is about 1.4 microns. An example LED 10 is typically 1 mm×1 mm square.

Increasing LED Light Emission Efficiency

FIG. 2 is a plot of the measured increase in LED (light) emission (%) versus post dimension (microns) for an LED such as shown in FIG. 1 and having uniform array 70 of posts 72 that define roughened surface 22 in a sapphire substrate 20. FIG. 3 is a perspective view of a portion of an example uniform array 70 of posts 72. FIG. 4 is a close-up perspective view of four posts in array 70 showing the edge-to-edge post spacing S, the post diameter D and the post height H. The post dimensions in the plot of FIG. 2 are given along the horizontal axis in (D, S, H) format. The LED light emission for an LED 10 having an unroughened sapphire surface 22 is shown for reference, and the increase in LED light emission is measured relative to this reference value (0%).

From the plot of FIG. 2, it is observed that the LED light emission generally increases for taller and narrower posts 72. For a uniform array 70, overlay requirements are not severe and occasional defects are not particularly problematic. However, the size of posts 72 is important, as is the repeatability and consistency of the high-volume process used to form the posts. It is noted that posts 72 can have any reasonable cross-sectional shape and are shown as cylindrical posts with a round cross-section by way of illustration. Posts 72 can be non-cylindrical (i.e., have sloped or non-straight sidewalls), can have rectangular or square cross-sectional shapes, a kidney-bean type shape, etc. Generally speaking, example posts 72 formed at or near the resolution limit of the photolithographic imaging process used to form the posts (as discussed below) have a rounded cross-sectional shape rather than sharp edges. Thus, the post diameter or width D is meant herein as a representative or effective dimension of the cross-sectional size of the post and is not limited to any particular shape. For example, post diameter D may refer to the major axis diameter of a post having an elliptical cross-sectional shape.

As discussed above, posts 72 can have a sub-micron diameter D, e.g., D=0.5 micron. Forming such posts using present-day photolithographic techniques would typically require a photolithographic system capable of imaging 0.5 micron features. Such systems, however, are typically designed for traditional semiconductor integrated circuit manufacturing for forming the critical layers (i.e., the layers having the smallest dimensions) and are generally considered prohibitively expensive for LED manufacturing.

Aspects of the present disclosure include photolithographic systems and methods for forming an array 70 of posts 72 on substrate surface 22 to fabricate LEDs having increased LED light emission efficiency as compared to the same LEDs having a smooth substrate surface. However, the systems and methods described herein are suitable for being carried out using non-critical-layer photolithographic systems in combination with a select type of phase-shift mask. The phase-shift mask is matched to the photolithography system's numerical aperture and illumination (i.e., "sigma") to form posts 72 having desired dimensions. This allows the photolithography system to print much smaller posts over a suitable depth of focus (DOF) than is possible using a traditional chrome-on-glass non-phase-shift mask.

Photolithographic Imaging

It is well known that grating-like structures can be produced in photoresist using two intersecting coherent light beams. Under normal conditions, two coherent beams with incident angles θ and wavelength λ can interfere to produce a periodic grating-like structure in the photoresist whose period P is given by $P=\lambda/(2*\sin\theta)$. A two dimensional grid-like (checkerboard) pattern in an x-y plane can be made by superimposing four coherent beams, namely two beams in the x-direction and two beams in the y-direction.

Figure 5:
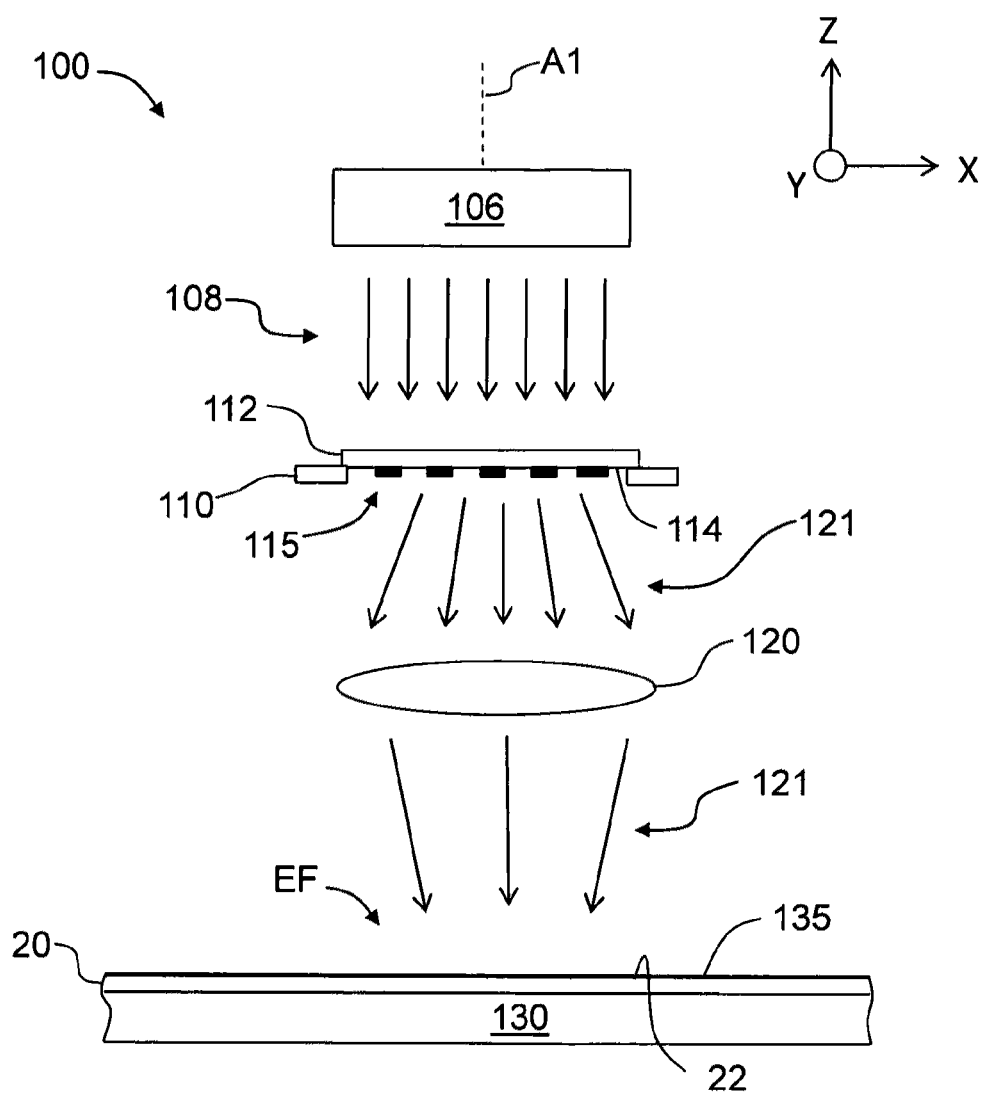
FIG. 5 is a schematic diagram of a generalized photolithography system used to conduct photolithographic imaging and to generally carry out the methods of the disclosure.
Figure 6:
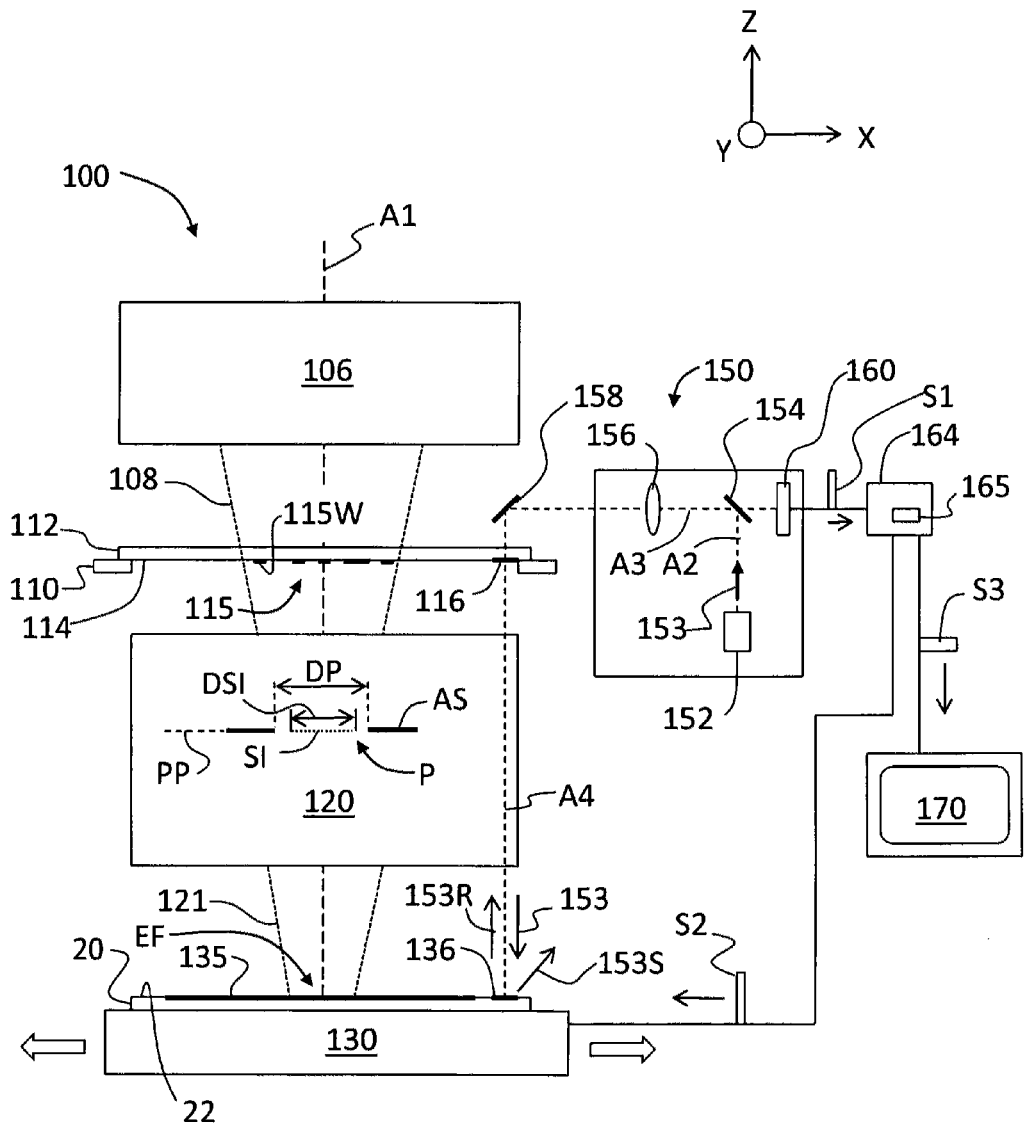
FIG. 6 is a more detailed schematic diagram of an example of the photolithography system shown in FIG. 5.

FIG. 5 is a schematic diagram of a generalized photolithography system 100, and FIG. 6 is a more detailed schematic diagram of an example photolithography system 100. Cartesian X-Y-Z coordinates are shown for reference. Photolithographic system 100 is configured to perform photolithographic imaging, which is also referred to herein as "photolithographic exposure" because the imaging results in the exposure of a photosensitive material, namely photoresist. Photolithographic imaging or photolithographic exposure generally means capturing light that passes through a mask and imaging the captured light at an image plane within a DOF, wherein a photosensitive material is arranged generally within the DOF to record the image.

With reference to both FIG. 5 and FIG. 6, photolithography system 100 includes, along a system axis A1, an illuminator 106, a mask stage 110, a projection lens 120, and a moveable substrate stage 130. Mask stage 110 supports a phase-shift mask 112 having a surface 114 with a phase-shift mask pattern 115 formed thereon. Substrate stage 130 supports substrate 20. Substrate 20 may be in the form of a wafer. In an example, photolithography system 100 is a 1:1 system (i.e., unit magnification system) that has a numerical aperture of about 0.3 and operates at mid-ultraviolet wavelengths such as the i-line (nominally 365 nm). In another example, a reduction photolithography system can be used. In an example, photolithography system 100 is suitable for use in processing non-critical layers in a semiconductor process. An example photolithography system 100 suitable for carrying out the systems and methods disclosed herein is the Sapphire™ 100 photolithography system, available from Ultratech, Inc., San Jose, Calif.

An example projection lens 120 includes a variable aperture stop AS that defines a pupil P with a diameter DP and that defines a pupil plane PP. Illuminator 106 is configured to illuminate phase-shift mask 112 by providing a source image SI that fills a portion of pupil P. In an example, source image SI is a uniform circular disc with a diameter DSI. The partial coherence factor of photolithography system 100 is defined as σ=DSI/DP, where pupil P is assumed to be circular. For different source images SI other than a simple uniform disc, the definition of the partial coherence a becomes more complicated. In an example, the illumination of phase-shift mask 112 is Kohler illumination or a variant thereof.

Photolithography system 100 also includes an optical alignment system 150, such as a through-the-lens alignment system as shown, which may utilize a machine-vision alignment system. Example optical alignment systems are disclosed in U.S. Pat. Nos. 5,402,205 and 5,621,813 and 6,898,306, and in U.S. patent application Ser. No. 12/592,735, which patents and patent application are incorporated by reference herein.

Figure 7:
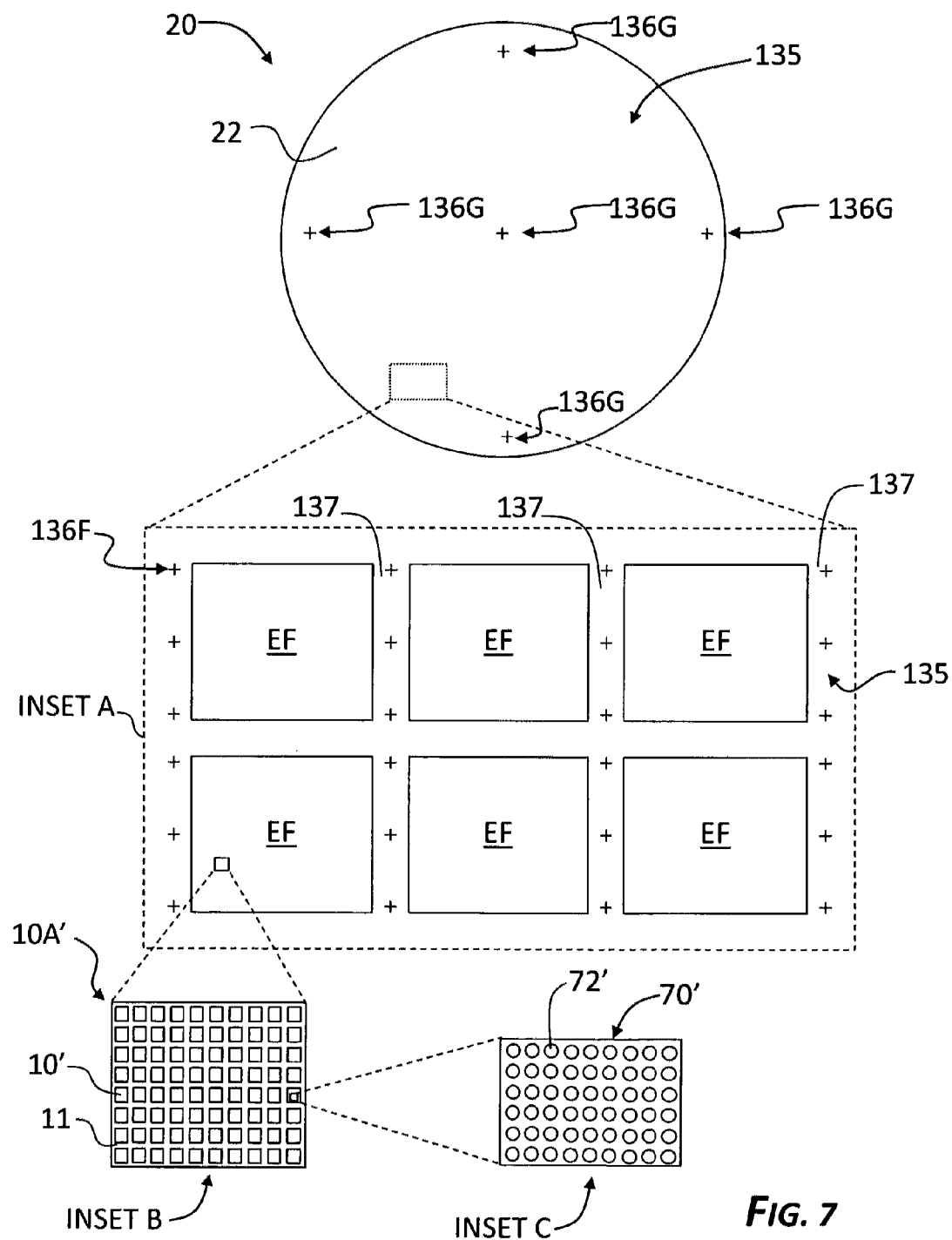
FIG. 7 is a plan view of an example substrate that has exposure fields as well as global and fine alignment marks, and also includes an Inset A that shows the exposure fields, an Inset B that shows LED regions within the exposure fields, and an Inset C that shows an array of photoresist posts formed in the LED regions.

FIG. 7 is a plan view of an example substrate 20 that has exposure fields EF as formed by photolithography system 100, and also includes global alignment marks 136G used for global alignment, as well as fine alignment marks 136F for fine alignment (see Inset A). Note that in the example shown that both types of alignment marks 136 reside in scribe areas 137 between or adjacent exposure fields EF. Exposure fields EF are discussed in greater detail below in connection with their formation using phase-shift mask 112 in the photolithographic process of forming LEDs 10.

With reference again to FIG. 6, an example optical alignment system 150 includes a light source 152 arranged along an axis A2 and that emits alignment light 153 of wavelength $\lambda_A$. A beam splitter 154 is arranged at the intersection between axis A2 and a perpendicular axis A3. A lens 156 and a fold mirror 158 are arranged along axis A3. Fold mirror 158 folds axis A3 to form an axis A4 that is parallel to system axis A1. Axis A4 travels through mask 112, through projection lens 120 and to substrate 20. Optical alignment system 150 also includes an image sensor 160 arranged along axis A3 adjacent beam splitter 154 on the side opposite lens 156 and fold mirror 158. Image sensor 160 is electrically connected to an image processing unit 164 configured to process digital images captured by image sensor 160. Image processing unit 164 is electrically connected to a display unit 170 and also to moveable substrate stage 130.

In the general operation of photolithography system 100, light 108 from illuminator 106 illuminates phase-shift mask 112 and phase-shift mask pattern 115 thereon, and the phase-shift mask pattern is imaged onto surface 22 of substrate 20 over a select exposure field EF (FIG. 7) via exposure light 121 from projection lens 120. The alignment patterns 115W form substrate alignment marks 136. Substrate surface 22 is typically coated with a light-sensitive material such as photoresist layer 135 (FIG. 5) so that phase-shift mask pattern 115 can be recorded and transferred to substrate 20.

Photolithography system 100 is used to form a relatively large number (e.g., thousands) of LEDs 10 using photolithographic imaging (photolithographic exposure) in combination with photolithographic processing techniques. The layers making up LEDs 10 are formed, for example, in a step-and-repeat or step-and-scan fashion and then processed together. Thus, prior to imaging phase-shift mask pattern 115 onto photoresist layer 135 to form the array 70 of exposure fields EF, the phase-shift mask pattern 115 must be properly aligned to the previously formed layer, and in particular to the previously formed exposure fields EF. This is accomplished by aligning substrate 20 relative to phase-shift mask 112 using one or more of the aforementioned substrate alignment marks 136 and an alignment reference, which in optical alignment system 150 is one or more mask alignment marks 116.

Thus, in the operation of optical alignment system 150, alignment light 153 from light source 152 travels along axis A2 and is reflected by beam splitter 154 along axis A3 towards lens 156. Alignment light 153 passes through lens 156 and is reflected by fold mirror 158 to pass through phase-shift mask 112 and projection lens 120 and to illuminate a portion of surface 22 of substrate 20, including substrate alignment mark 136. A portion 153R of alignment light 153 is reflected from substrate surface 22 and substrate alignment mark 136 and travels back through projection lens 120 and through phase-shift mask 112, and in particular through mask alignment mark 116. In the case where substrate alignment mark 136 is diffractive, then diffracted light 153S from the substrate alignment mark 136 is collected.

The combination of projection lens 120 and lens 156 forms from reflected light portion 153R a superimposed image of the substrate alignment mark 136 and mask alignment mark 116 on image sensor 160. Here, mask alignment mark 116 serves as an alignment reference. In other types of optical alignment systems such as off-axis systems, the alignment reference is the optical alignment system optical axis as calibrated based on lithography system fiducials.

Image sensor 160 generates an electrical signal Si representative of the captured digital image and sends it to image processing unit 164. Image processing unit 164 is adapted (e.g., via image processing software embodied in a computer-readable medium such as a memory unit 165), to perform image processing of the received digital image. In particular, image processing unit 164 is adapted to perform pattern recognition of the superimposed substrate and mask alignment mark images to measure their relative displacement and generate a corresponding stage control signal S2 that is sent to moveable substrate stage 130. Image processing unit 164 also sends an image signal S3 to display unit 170 to display the superimposed substrate and mask alignment mark images.

In response to stage control signal S2, moveable substrate stage 130 moves in the X, Y plane (and also in the Z-plane, if necessary, for focusing purposes) until the images of mask and substrate alignment marks 116 and 136 are aligned (i.e., directly superimposed), indicating proper alignment of phase-shift mask 112 and substrate 20.

With reference again to FIG. 5, the imaging of phase-shift mask pattern 115 can be viewed as a diffraction process whereby light 108 incident upon phase-shift mask 112 is diffracted by phase-shift mask pattern 115 to form (diffracted) exposure light 121, with some of this (diffracted) exposure light 121 (i.e., the lowest diffraction orders, e.g., the zero order and the plus and minus first orders) being captured by projection lens 120 and imaged onto photoresist layer 135. The quality of the image formed by projection lens 120 is directly related to the number of the diffracted orders it collects, as well as to the aberrations of the projection lens 120. Note that the zero-order diffracted beam is simply a straight-through component that contributes a "DC" background level of intensity to the image and as such is generally not desired.

Thus, when the photolithographic imaging process is viewed as a diffraction process, photolithography system 100 can be configured to optimize this diffraction process to form a desired image. In particular, with the proper design of phase-shift mask 112 and the phase-shift regions R therein, the zero-order diffracted beam can be eliminated. Further, with a proper choice of the numerical aperture AS for projection lens 120, one can collect select which diffracted orders will contribute to the photolithographic imaging process. Specifically, the numerical aperture AS can be adjusted so that only the two first-order diffracted beams are captured by projection lens 120.

Moreover, the aforementioned grid-like or checkerboard pattern can be formed at substrate 20 by creating a two-dimensional periodic phase-shift mask pattern 115 on phase-shift mask 112 so that first-order beams are generated in both the x-direction and the y-direction. However, care must be taken to ensure that the zero-order beam is substantially eliminated, and to do so the electric field for the transmitted zero-order beam must be substantially zero in amplitude. This is accomplished in one embodiment by configuring phase-shift mask 112 so that the different phase-shift regions R have the same area.

Example Phase-Shift Masks

Figure 8A:
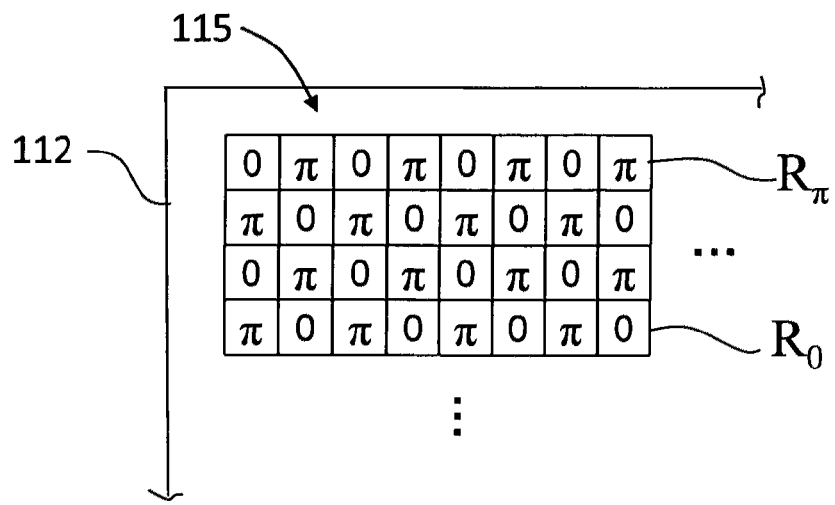
FIG. 8A is a schematic diagram of a portion of an example phase-shift mask where the mask pattern comprises regions R, with transmissive regions $R_0$ having a 0° phase shift and transmissive regions $R_\pi$ having 180° (π) phase shift.
Figure 8B:
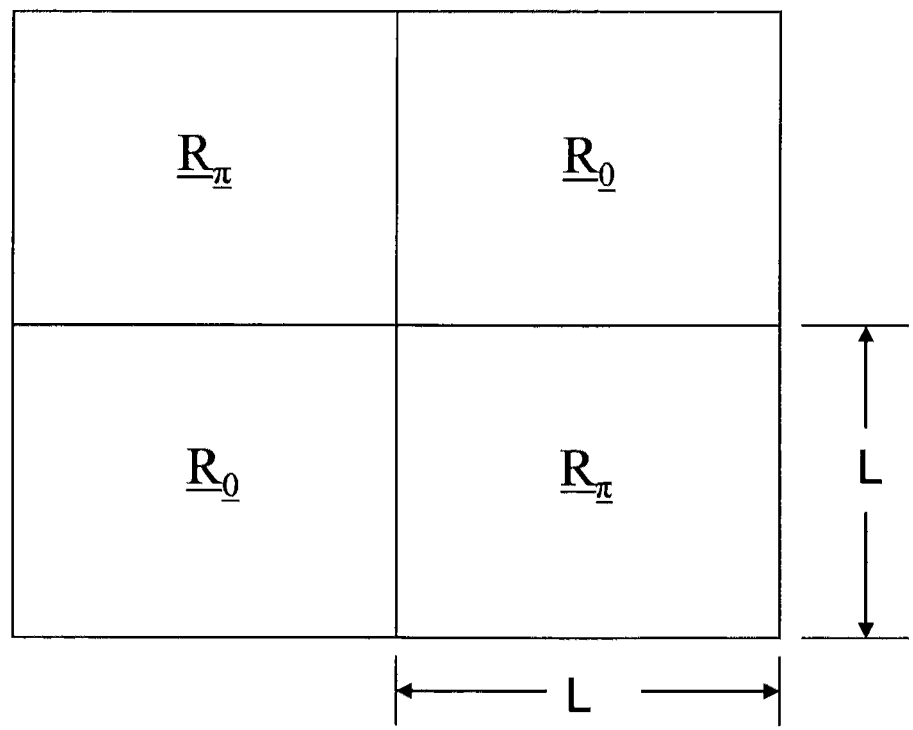
FIG. 8B is a close-up view of four regions R of the phase shift mask of FIG. 8A.

FIG. 8A is a schematic diagram of a portion of an example phase-shift mask 112 where phase-shift mask pattern 115 comprises transmissive phase-shift regions R, with transmissive phase-shift regions $R_0$ having a 0° phase shift and transmissive phase-shift regions $R_\pi$ having a 180° ($\pi$) phase shift. FIG. 8B is a close-up view of four phase-shift regions R of phase-shift mask 112 of FIG. 8A. Phase-shift regions $R_0$ and $R_\pi$ are square with a dimension (side length) L, with the phase-shift regions R having equal area and configured in a checkerboard pattern. In an example embodiment, phase-shift regions R can have any reasonable shape, and in particular can have at least one of a circular shape, oval shape and a polygonal shape.

Photolithography system 100, when configured with phase-shift mask 112 having a period phase-shift mask pattern 115, can perform photolithographic imaging to form in photoresist layer 135 corresponding periodic (e.g., checkerboard) features with dimensions of about L/2, i.e., substantially half that of dimension L of the phase-shift regions R of the phase-shift mask 112. Specifically, there is a spatial-period doubling during the imaging process, whereby the spatial period of phase-shift mask pattern 115 is substantially doubled at substrate surface 22, so that twice as many dark and light regions are created at the substrate 20. This is because the zero-order diffraction beam has been eliminated, allowing for combination of the zero-order beam with each the first-order beam that reproduces the original spatial period of the phase-shift mask 112. By eliminating the zero-order beam, only the two first-order beams are imaged. When these two first-order beams are combined, they produce a sinusoidal pattern with twice the spatial period of the original phase-shift mask pattern 115. Thus, when L=1 micron, photoresist features having a dimension of L/2=0.5 micron can be formed.

A rule of thumb in photolithographic imaging is that the minimum feature size FS that can be printed (i.e., imaged into photoresist layer 135 with sharp features) with a photolithography system having an imaging wavelength $\lambda_I$ and a NA is $FS=k_1\lambda_I/NA$, where $k_1$ is a constant typically assumed to be between 0.5 and 1, depending on the particular photolithographic process. The DOF is given by $k_2\lambda_I/NA^2$, where $k_2$ is another process-based constant that depends on the particular photolithographic process and is often approximately 1.0. Thus, there is a tradeoff between feature size FS and DOF.

Substrates 20 used for LED manufacture are traditionally not nearly as flat as substrates used in semiconductor chip manufacturing. In fact, most LED substrates 20 have a warpage (due to MOCVD processing) that exceeds many tens of microns (peak-to-valley) across the substrate surface, and about 5 microns (peak-to-valley) over each exposure field. This degree of non-planarity has generally been considered highly problematic for using a photolithography imaging process to form LEDs 10 because of the attendant limited DOF relative to the amount of substrate non-flatness.

In a traditional photolithographic processes that uses conventional photolithography photoresists, the minimum feature size (linewidth) that can be created in the photoresist is given by $0.7*\lambda_I/NA$ (i.e., $k_1$ is equal to 0.7). For the condition where it is desirable to print features that are 1 micron in size, the required NA is 0.255 when using an imaging wavelength of $\lambda_I$=365 nm. With this NA, the DOF for an unaberrated imaging system is 5.6 microns, which is on the order of the within-field substrate non-flatness of a typical LED substrate 20. This means that it will be difficult to get an entire exposure field EF to reside within the DOF. Consequently, posts 72 that are formed outside of the DOF will not meet the necessary size and shape requirements.

However, when using a phase-shift mask and conventional photolithography photoresists, the minimum feature size that can be printed is given by $0.3*\lambda_I/NA$ (i.e., $k_1$ is equal to 0.3). This has the practical effect of reducing the needed NA by about half and increasing the DOF by about 4× as compared to using a conventional mask. Thus, for a given post diameter D, $NA=k_1\lambda_I/D$, and the DOF becomes:

$$DOF=k_2\lambda_I/NA^2=k_2\lambda_I/[k_1\lambda_I/D]^2=k_2D^2/k_1^2\lambda_I$$

By way of example, to photolithographically expose photoresist to obtain posts 72 that have a diameter D=1 micron using an imaging wavelength $\lambda_I$=365 nm, the required NA is now only 0.11, and the DOF is now over 30 microns so that each exposure field EF for non-flat LED substrates 20 will fall well within the DOF.

In an example, photolithography systems 100 used to carry out the methods described herein have a relatively low projection lens NA (e.g., of 0.5 or lower) as compared to present-day critical-level projection lens NAs (e.g., of 0.5 and greater), and also have a relatively large imaging wavelength (e.g., of about $\lambda_I$=356 nm, or any of the other mercury lines), as compared to present-day critical level imaging wavelengths (e.g., deep 193 nm). Consequently, lower-NA, longer-wavelength photolithography systems 100 are preferred because they are generally much less expensive to purchase, operate and maintain than the higher-NA, shorter-wavelength advanced photolithography systems used for critical-levels in semiconductor manufacturing of integrated circuits.

Figure 9A:
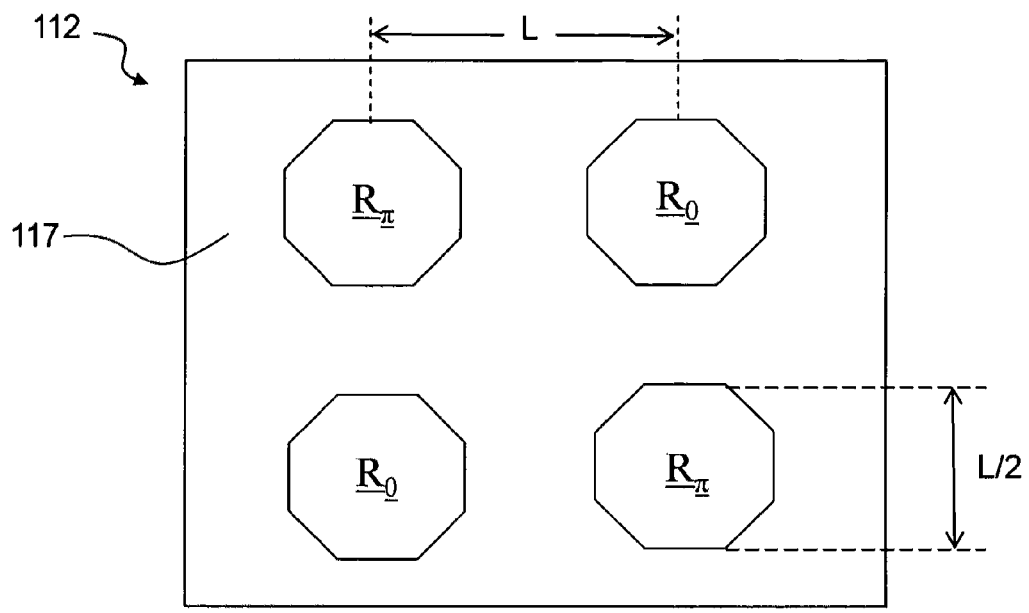
FIG. 9A is a schematic diagram of another example phase-shift mask that can be used to form an array of sub-micron posts, wherein the phase-shift regions are spaced apart and have a polygonal shape.
Figure 9B:
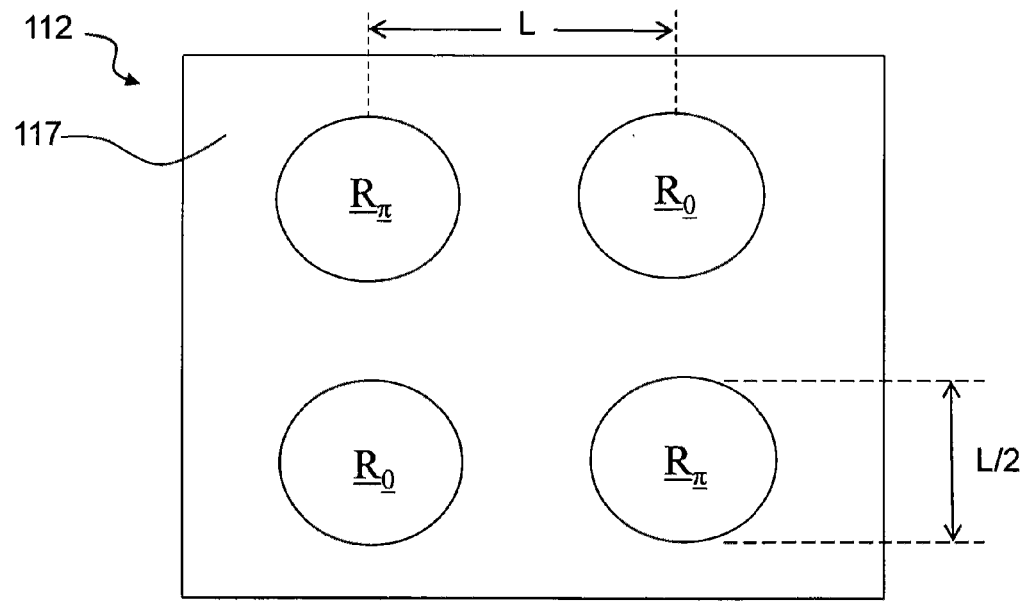
FIG. 9B is similar to FIG. 9A, but wherein the phase-shift regions are circular.

FIG. 9A is a schematic diagram of another example phase-shift mask 112 that can be used to form an array 70 of posts 72 having a sub-micron dimension. The phase-shift mask 112 of FIG. 9A is similar to that of FIG. 8A and FIG. 8B, except that there is an opaque background section 117, and phase-shift regions $R_0$ and $R_\pi$ have dimensions L/2 and are spaced apart from one another. Phase-shift regions $R_0$ and $R_\pi$ are shown as being octagonal by way of illustration of an example type of polygonal phase-shift regions. FIG. 9B is similar to FIG. 9A, but illustrates an example phase-shift mask 112 wherein the phase-shift regions R are circular.

Opaque background section 117 can be coated with an absorber layer, such as chrome or aluminum. Phase-shift regions $R_0$ and $R_\pi$ are printed in photoresist layer 135 with substantially the same dimension L/2, which is beyond the traditional resolution limit of a 1 micron design photolithography system 100. An advantage of the configurations of phase-shift masks 112 of FIG. 9A and FIG. 9B is that it is easier to control the geometry and spacing of the final photolithographic image that forms array 70 of posts 72.

Figure 10:
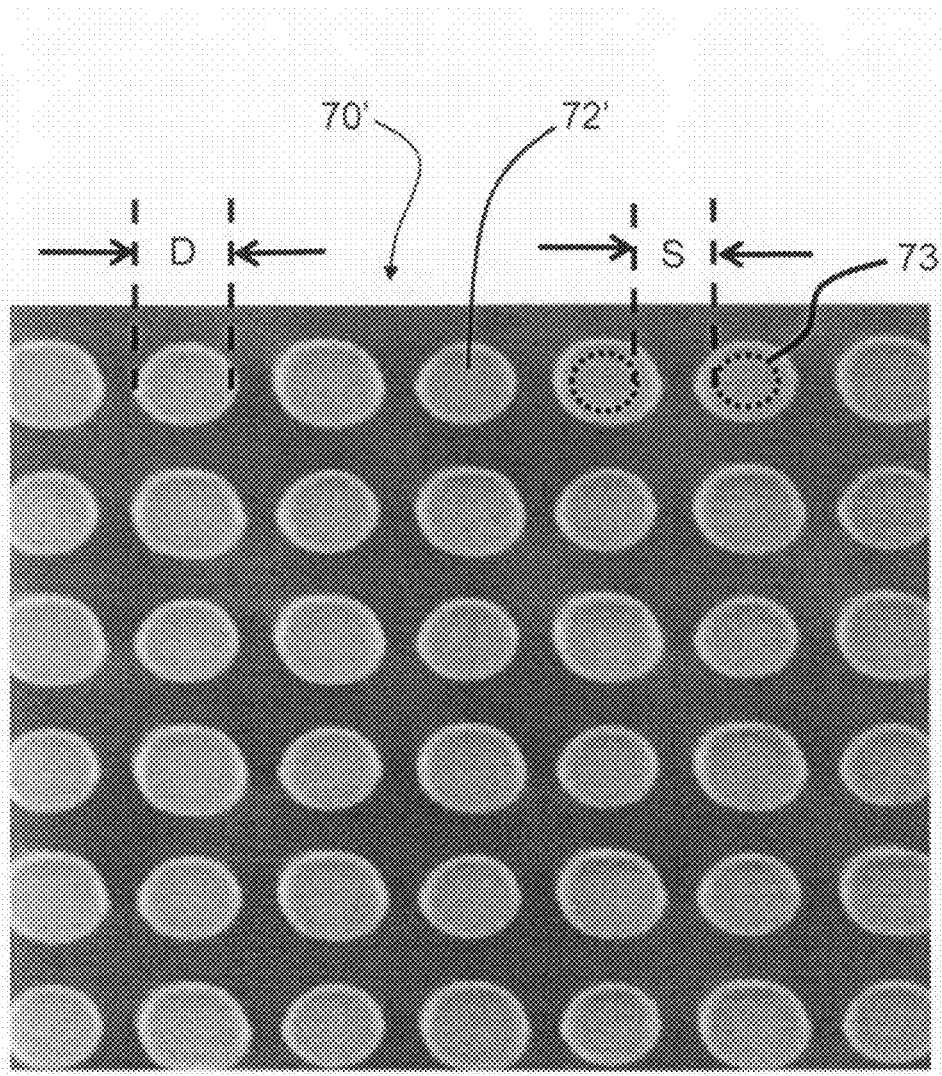
FIG. 10 is a scanning electron microscope image of an example array of pillars formed in a photoresist having a 3 micron thickness and using a phase-shift mask similar to that of FIG. 9A, with regions $R_0$ and $R_\pi$ and with L/2=0.6.

FIG. 10 is a scanning electron microscope (SEM) image of an example array 70' of photoresist posts 72' formed in photoresist layer 135 having a 3 micron thickness and using a phase-shift mask 112 similar to that of FIG. 9A, with phase-shift regions $R_0$ and $R_\pi$ with L/2=0.6. The diameter (width) D of each photoresist post 72' is about 0.6 microns. Actual edge-to-edge spacing S is also about 0.6 microns, but there is some spreading of photoresist posts 72' at their bases that makes the photoresist posts 72' appear abnormally wide in the top-down view of FIG. 10. The two dashed circles 73 represent an estimation of the actual size and shape of the top of photoresist posts 72'.

Example Method for Forming the Roughened Substrate Surface

Thus, an aspect of the disclosure includes a method of forming a roughed substrate surface 22 having an array 70 of posts 72 in the course of forming LEDs 10 using photolithographic imaging and photolithographic processing techniques. An example method of forming array 70 of posts 72 is now described with reference to FIG. 6 and also to FIGS. 11A through 11D.

Figure 11A:
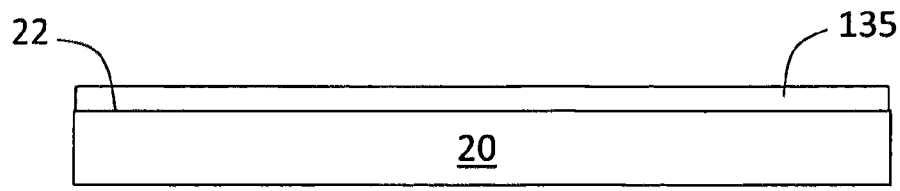
FIGS. 11A through 11D are schematic cross-sectional views of a substrate being processed to form an array of posts in the substrate surface using photolithographic imaging with a phase-shift mask and photolithographic processing techniques in the course of forming LEDs according to the present disclosure.

With reference first to FIG. 11A, the method includes providing a substrate 20 having photoresist layer 135 atop surface 22 of substrate 20. The method then includes arranging the coated substrate 20 on moveable substrate stage 130 of photolithography system 100 (FIG. 6). A phase-shift mask 112 such as described above is arranged at mask stage 110 of photolithography system 100. The method then includes operating photolithography system 100 to perform photolithographic imaging whereby phase-shift mask 112 is exposed with illumination light 108 and the resultant (diffracted) exposure light 121 from phase-shift mask pattern 115 is capture and imaged by projection lens 120 to expose photoresist layer 135 over an exposure field EF to form an array 70' of photoresist posts 72' over substantially the entire exposure field EF. This is illustrated in FIG. 11B.

Note that many LED regions 10' are formed in photoresist layer 135 for each exposure field EF. Thus, in an example where phase-shift mask pattern 115 has an area of 15 mm×30 mm, and where each LED 10 is 1 mm square, then there are 450 LED regions 10' associated with each exposure field EF, which is also 15 mm×30 mm when photolithography system operates at unit magnification.

With reference once again to FIG. 7, illustrated therein is an Inset B that shows an array 10A' of LED regions 10' associated with the formation of LEDs 10. The LED regions 10' are separated by scribe areas 11. Array 70' of photoresist posts 72' is formed everywhere over exposure field EF (see FIG. 7, Inset C), including in scribe areas 137 shown in Inset A. Field-to-field stitching may be required at the exposure field borders, but this can be addressed by making the size of phase-shift mask pattern 115 an integer multiple of LED region array 10A' so that any stitching errors fall into exposure field scribe areas 137. Also, photoresist posts 72' formed at the edge of exposure field EF will be slightly different from those in the center because of the phase-shift mask pattern edge leaves some of the phase-shift regions R only partially surrounded by other phase-shift regions. Thus, in an example, photoresist posts 72' at the edge of exposure field EF are formed in exposure field scribe areas 137 so that the corresponding substrate posts 72 do not get incorporated into LED 10.

Figure 11B:
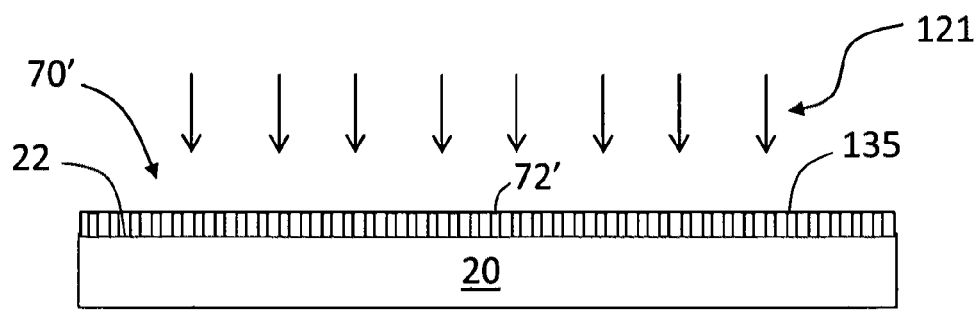
Figure 11C:
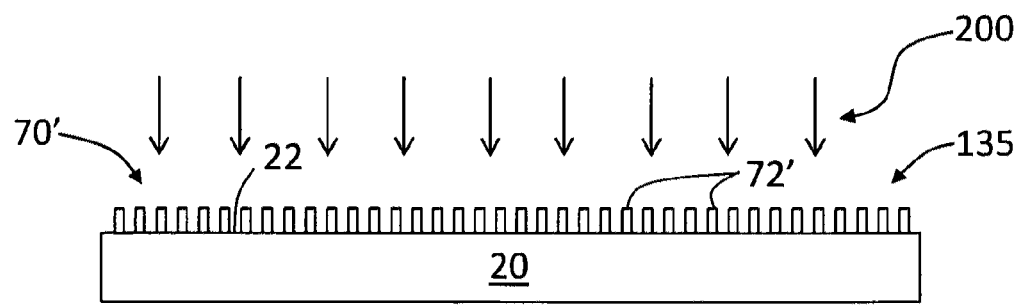
Figure 11D:
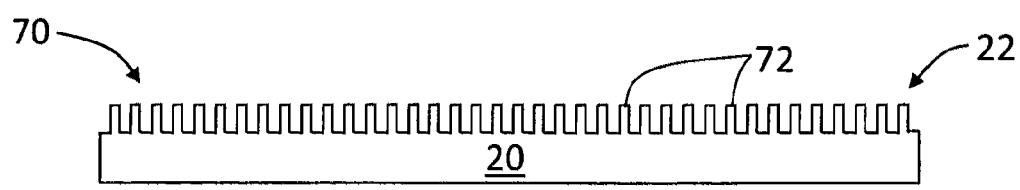

With reference now to FIG. 11C, the exposed photoresist layer 135 of FIG. 11B is processed to remove unexposed resist (negative photoresist) or to remove exposed resist (positive photoresist) to leave array 70' of photoresist posts 72' or its complementary feature, a hole. This photoresist array 70' is then etched using standard photolithographic etching techniques as indicated by arrows 200 to transfer the photoresist pattern into the substrate 20, thereby forming array 70 of posts 72 in surface 22 of substrate 20, as shown in FIG. 11D.

Now that substrate 20 is configured with a plurality of LED regions 10' having a suitably post-roughened substrate surface 22, LEDs 10 are fabricated using standard photolithography-based LED fabrication techniques. This includes, for example, forming GaN multilayer structure 30 atop the roughened surface 22 of substrate 20 and then adding p-contact 90p and n-contact 90n to layers 50 and 40, respectively, as shown in FIG. 1.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A photolithographic method of forming a roughened surface for a light-emitting diode (LED) to improve LED light emission efficiency, comprising:
   providing a semiconductor substrate having a surface covered with photoresist;
   photolithographically imaging a phase-shift mask pattern onto the photoresist using a single exposure, the phase-shift mask pattern comprising a two-dimensional periodic array of first and second phase-shift regions that are separated by an opaque background section and that have a sub-resolution dimension and a sub-resolution spatial frequency, said photolithographic imaging forming in the photoresist a periodic array of sub-resolution photoresist features having substantially the sub-resolution spatial frequency and substantially the sub-resolution dimension of the first and second phase-shift regions;
   defining the roughened substrate surface by processing the photoresist and the photoresist features therein to form a corresponding periodic array of substrate posts in the substrate surface; and
   forming a p-n junction multilayer structure atop the roughened substrate surface to form the LED, with the periodic array of substrate posts serving as scatter sites that improve the LED light emission efficiency as compared to the LED having no roughened substrate surface.

2. The method of claim 1, further comprising the substrate being made of one of: sapphire, SiC, GaN and Si.

3. The method of claim 1, wherein the photolithographic imaging is performed at an imaging wavelength, and wherein first and second phase-shift regions are configured to provide respective phase shifts of 0° and 180° at the imaging wavelength.

4. The method of claim 1, further comprising the imaging wavelength being 365 nm and the photolithographic imaging being performed at unit magnification.

5. The method of claim 1, wherein the substrate posts have a diameter, a spacing and a height, the method further comprising performing the photolithographic imaging at a numerical aperture that provides a maximum depth of focus for the diameter, the spacing and the height.

6. The method of claim 1, wherein the first and second phase-shift regions have at least one of a circular shape, an oval shape and a polygonal shape.

7. The method of claim 1, further comprising forming the substrate posts to have a width of 2 microns or less.

8. The method of claim 7, further comprising forming the substrate posts to have an edge-to-edge spacing of between 0.5 microns and 3 microns.

9. The method of claim 8, further comprising forming the substrate posts to have a height of up to 2 microns.

10. The method of claim 1, further comprising the periodic array of substrate posts having a substantially 1:1 pitch.

11. The method of claim 1, wherein the photolithographic imaging has a depth of focus of greater than 30 microns.

12. A method of forming a light-emitting diode (LED), comprising:
   performing a single photolithographic exposure to photolithographically expose photoresist supported by a semiconductor substrate to form therein an array of photoresist posts having a second spatial frequency, the single photolithographic exposure including passing illumination light once through a phase-shift mask having a two-dimensional pattern comprising first and second phase-shift regions that are spaced apart by an opaque background section and that have a sub-resolution dimension and a sub-resolution spatial frequency, wherein the single photolithographic exposure has a numerical aperture of 0.5 or less and an imaging wavelength defined by a mercury line;
   processing the photoresist to form an array of substrate posts that defines a roughened substrate surface and that have substantially the sub-resolution dimension and substantially the sub-resolution spatial frequency of the first and second phase-shift regions; and
   forming a p-n multilayer structure atop the roughened substrate surface to form the LED, wherein the roughened substrate surface acts to scatter light generated by the p-n multilayer structure to increase an amount of light emitted by the LED as compared to the LED having an unroughened substrate surface.

13. The method of claim 12, further comprising:
   the substrate posts having at least one dimension of 0.5 microns; and
   the single photolithographic exposure having a numerical aperture of 0.5 or less and an imaging wavelength of about 365 nm.

14. The method of claim 12, further comprising the substrate being a sapphire substrate.

15. The method of claim 12, wherein the opaque background section comprises a coating of either aluminum or chrome.

16. The method of claim 12, wherein the first and second phase-shift regions have at least one of a circular shape, an oval shape and a polygonal shape.

17. The method of claim 12, wherein the photolithographic exposure is performed at an imaging wavelength, and wherein first and second phase-shift regions are configured to provide respective phase shifts of 0° and 180° at the imaging wavelength.

18. The method of claim 12, further comprising the photolithographic exposure being performed at unit magnification.

19. The method of claim 12, further comprising the substrate posts have a dimension of one micron or less and further comprising performing said photolithographic exposure at a numerical aperture of 0.5 or less.

* * * * *